US005977828A

United States Patent [19]
Hu et al.

[11] Patent Number: 5,977,828
[45] Date of Patent: Nov. 2, 1999

[54] MULTIPLE-TAIL TRANSCONDUCTANCE SWITCHABLE GAIN AMPLIFER

[75] Inventors: Xiaoyun Hu; John Jackson Nisbet, both of Nepean, Canada

[73] Assignee: Nortel Networks Corporation, Montreal, Canada

[21] Appl. No.: 08/989,653

[22] Filed: Dec. 12, 1997

[51] Int. Cl.$^6$ .................................................. H03F 3/45
[52] U.S. Cl. ........................ 330/254; 330/278; 330/395
[58] Field of Search .................................. 330/254, 278, 330/279, 295; 327/359

[56] References Cited

U.S. PATENT DOCUMENTS

| | | | |
|---|---|---|---|
| 4,460,872 | 7/1984 | Mattison | 330/252 |
| 5,216,384 | 6/1993 | Vanhecke | 330/279 |
| 5,313,172 | 5/1994 | Vagher | 330/254 |
| 5,420,538 | 5/1995 | Brown | 330/295 |
| 5,461,342 | 10/1995 | Crabtree | 330/252 |
| 5,619,169 | 4/1997 | Matsuura | 330/254 |

OTHER PUBLICATIONS

RF–Heterodyne Receiver Design Technique for Digital Cellular Wireless Systems, *Josef Fenk, Siemens, 1995, pp. 1–85*.

*Primary Examiner*—Benny Lee
*Assistant Examiner*—Khanh Van Nguyen

[57] ABSTRACT

This invention relates to variable gain amplifiers. The general technique described consists of adding gain elements in parallel in order to create multiple-gain amplifier stages versus the usual dual-gain amplifier stages separated from one another by DC level shift modules. The gain elements are enabled or disabled individually in combinations, which provide a range of controlled gain steps. The main advantages are that current consumption and design complexity are greatly reduced, thereby increasing operating battery life of the device using this type of amplifier.

14 Claims, 5 Drawing Sheets

MULTIPLE-TAIL TRANSCONDUCTANCE SWITCHABLE GAIN AMPLIFER

CROSS REFERENCE TO RELATED APPLICATIONS

This application is related to U.S. Provisional Application Ser. No. 60/056,239 filed Aug. 28, 1997 in the name of the same inventors and entitled MULTIPLE-TAIL TRANSCONDUCTANCE SWITCHABLE GAIN-CONTROL.

FIELD OF THE INVENTION

The present invention relates to variable gain amplifiers. The system is particularly useful for communication systems where a wide range of signal levels needs to be handled.

BACKGROUND OF THE INVENTION

In wireless receivers, a wide range of signal levels needs to be handled. Some of the reasons for this wide range of signal levels are that changes in the path loss are frequent and so are changes in distance from the transmitter to the receiver. One of the most common methods of accommodating this high dynamic range requirement is to use a variable gain element. This element (or elements), with some control circuitry, acts in such a manner that the signal level at the receiver output is kept constant.

One method of implementing a variable gain element known to those skilled in the art is Lo use dual-gain emitter-coupled differential pairs. This method is shown on page 46 of "RF-Heterodyne Receiver Design Technique for Digital Cellular Wireless Systems" published in 1995 by Josef Fenk of Siemens. This publication is hereby incorporated by reference. With one single amplifier stage, two different values of gain may be realized In order to accomplish multiple gains, several stages of dual-gain amplifiers are stacked in series. This method is also well known to those skilled in the art. With this method, stacking three dual-gain amplifiers cells in series will result in eight different gain values. Several points should be noted concerning this realization. First, in order for it to work, it is necessary that proper DC level shifting be performed at the interface of different dual-gain amplifiers. Second, when this circuit is in operation, one differential pair in each dual-gain cell must be turned on for each gain setting. This results in unnecessary power consumption.

Thus, there exists a need in the industry to provide an improved switchable gain amplifier particularly well suited for an environment where multiple levels of gain are required.

OBJECTIVES AND SUMMARY OF THE INVENTION

An object of this invention is to provide an improved variable gain amplifier.

As embodied and broadly described herein, the invention provides a variable gain amplifier circuit comprising:
an array of amplification gain elements capable of amplifying a signal to different gain values;
an input node in a first electrical pathway with said array of amplification gain elements to permit an electrical signal impressed to said input node to propagate to a selected one of said gain elements;
a control unit in operative relationship with said array of amplification gain elements to activate a selected one of said gain elements in dependence of a desired level of signal amplification;
an output node in a second electrical pathway with said array of amplification gain elements, a gain element of said array activated by said control unit impressing at said output node an output signal;
a parasitic capacitance isolation element in said second electrical pathway between said array of amplification gain elements and said output node, said parasitic capacitance isolation element decreasing a capacitive feedback admittance of said output node.

In a most preferred embodiment the variable gain amplifier includes two or more amplifier stages, the number of stages being sufficient to provide an adequate range of signal amplification. Each amplifier stage includes two branches, each branch receiving one terminal ($V_{in}+$, $V_{in}-$) of the input signal pathway. Each branch includes a bipolar junction transistor, the two transistors forming a differential pair. The input signal is applied to the base terminals of the transistors to modulate the current flow in the branches.

To reduce the capacitive feedback admittance at the output node, which increases due the parallel connection of a plurality of gain stages, a transimpedance buffer is placed between the output node of the amplifier and the array of amplifier stages to form an isolation element reducing the capacitive feedback admittance as seen from the output node. The transimpedance buffer can comprise simple transistors that are in constant conduction (turned on) by an independent voltage source.

As embodied and broadly described herein, the invention also provides a variable gain amplifier circuit comprising:
an array of amplification gain elements capable of amplifying a signal to different gain values;
each gain element including a gain element input and a gain element output, an input signal impressed at said gain element input causing said gain element to impress at said gain element output an output signal related to said input signal by a certain gain value,
each gain element also including a solid state switch responsive to a signal to activate the gain element and permit the generation of said output signal upon application of said input signal at said gain element input.
a control unit in operative relationship with said array of amplification gain elements to activate a selected one of said gain elements in dependence of a desired level of signal amplification, said control input including:
  a plurality of actuation channels, each actuation channel being connected to a solid state switch of a corresponding gain element;
  a plurality of output channels associated to respective gain elements, each output channel being connected to the gain element output of a respective gain element;
  an output node, said control unit being responsive to a control signal indicative of a desired gain value to:
    a) generate a signal on an actuation channel of a selected one of said gain elements corresponding to the desired gain value to actuate said selected one of said gain elements;
    b) establish a connection between said output node and the output channel connected to the gain element output of said selected one of said gain elements, thereby permitting to transfer to said output node the output signal generated at the gain element output of said selected one of said gain elements.

DESCRIPTION OF A PREFERRED EMBODIMENT

The present invention provides an improved switchable gain amplifier that is particularly well suited for use in communication networks where multiple levels of gain must be handled.

Figure 1:
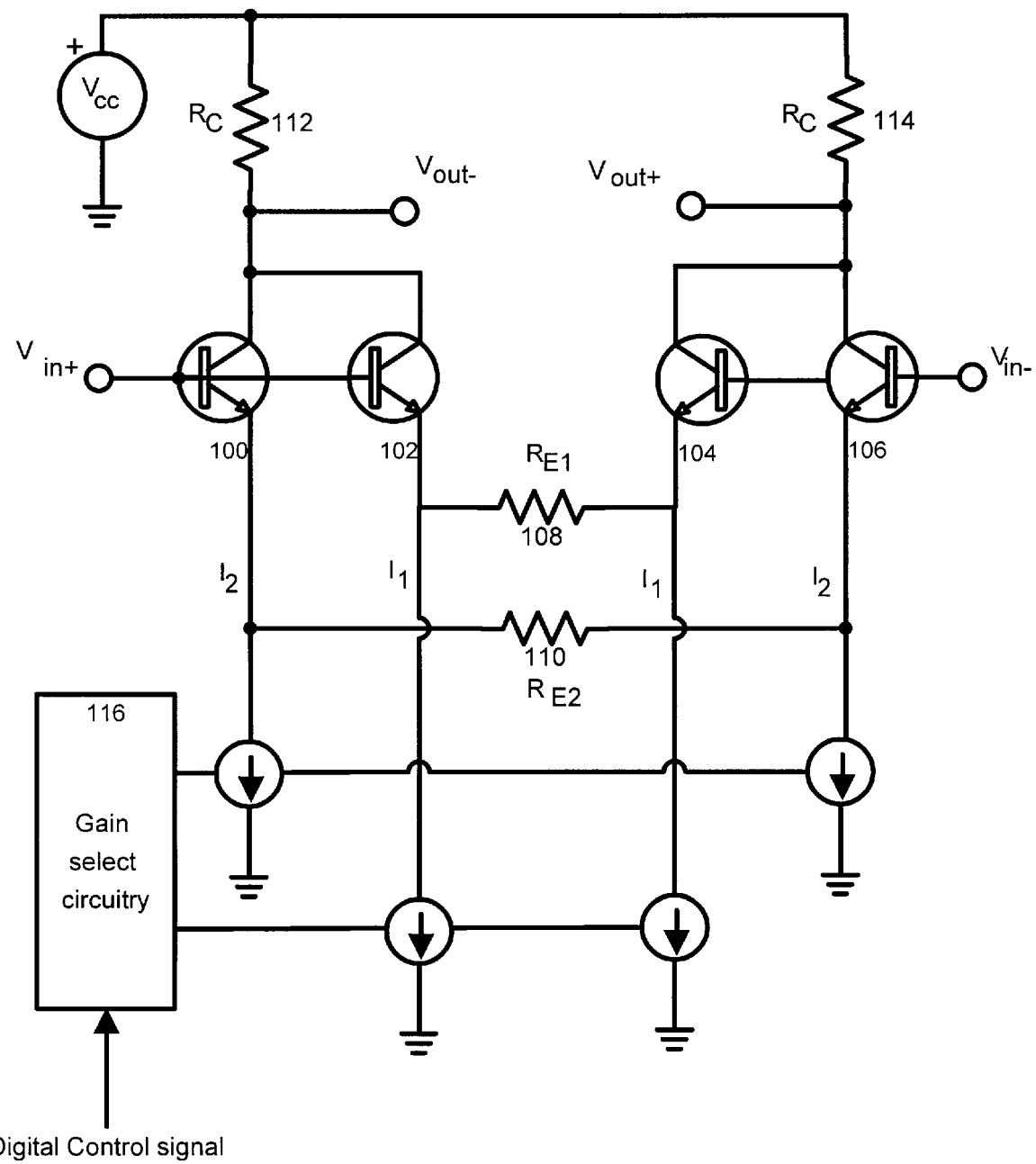
FIG. 1 is a block diagram showing a dual-gain emitter-coupled differential pair amplifier.

FIG. 1 illustrates a dual-gain emitter-coupled differential pair amplifier, which is well known to those skilled in the art. In this circuit, the emitter-degenerated differential pair (e.g. transistors 102 and 104 with $R_{E1}$ 108 or transistors 100 and 106 with $R_{R2}$ 110) acts as a transconductance cell that converts the input voltage signal to a differential current signal. This current signal then goes into the collector resistors $R_c$ 112 and 114 to produce a differential output voltage signal. By switching the cell current $I_1$ or $I_2$ on, through the use of gain select circuitry 116, two different transconductance cells are switched in, and as a result, two different values of gain are realized. These values can be calculated according to:

$$A_{vt} = \frac{2R_c}{R_{Ei}} \qquad i = 1, 2 \qquad \text{Eq. 1}$$

Figure 2:
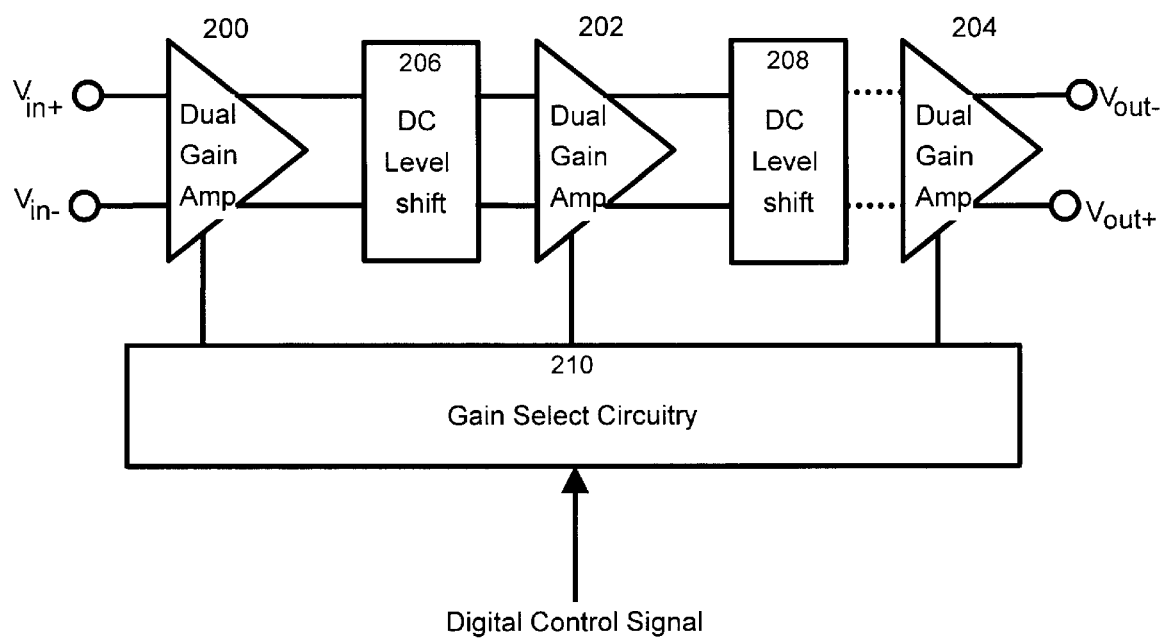
FIG. 2 is a block diagram showing several stages of dual-gain amplifiers stacked in series.

In order to obtain more than two values of gain, several stages of dual-gain amplifiers may be stacked in series. FIG. 2 shows a block diagram illustrating this embodiment with three dual-gain amplifiers 200, 202 and 204 in series. This embodiment permits eight different gain values since each dual-gain amplifier permits two gain values. The gain select circuitry 210 receives the input digital control signal and determines, by digital decoding, the gain selection for each dual-gain amplifier in order to achieve the required overall gain value. DC level shifters 206 and 208 are required between each dual-gain amplifier in order that the DC voltage is kept in the functioning range of the dual-gain amplifiers. Another point to note concerning this circuit is that, when it is in operation, one differential pair in each dual-gain amplifier must be turned on for each gain setting.

Figure 3:
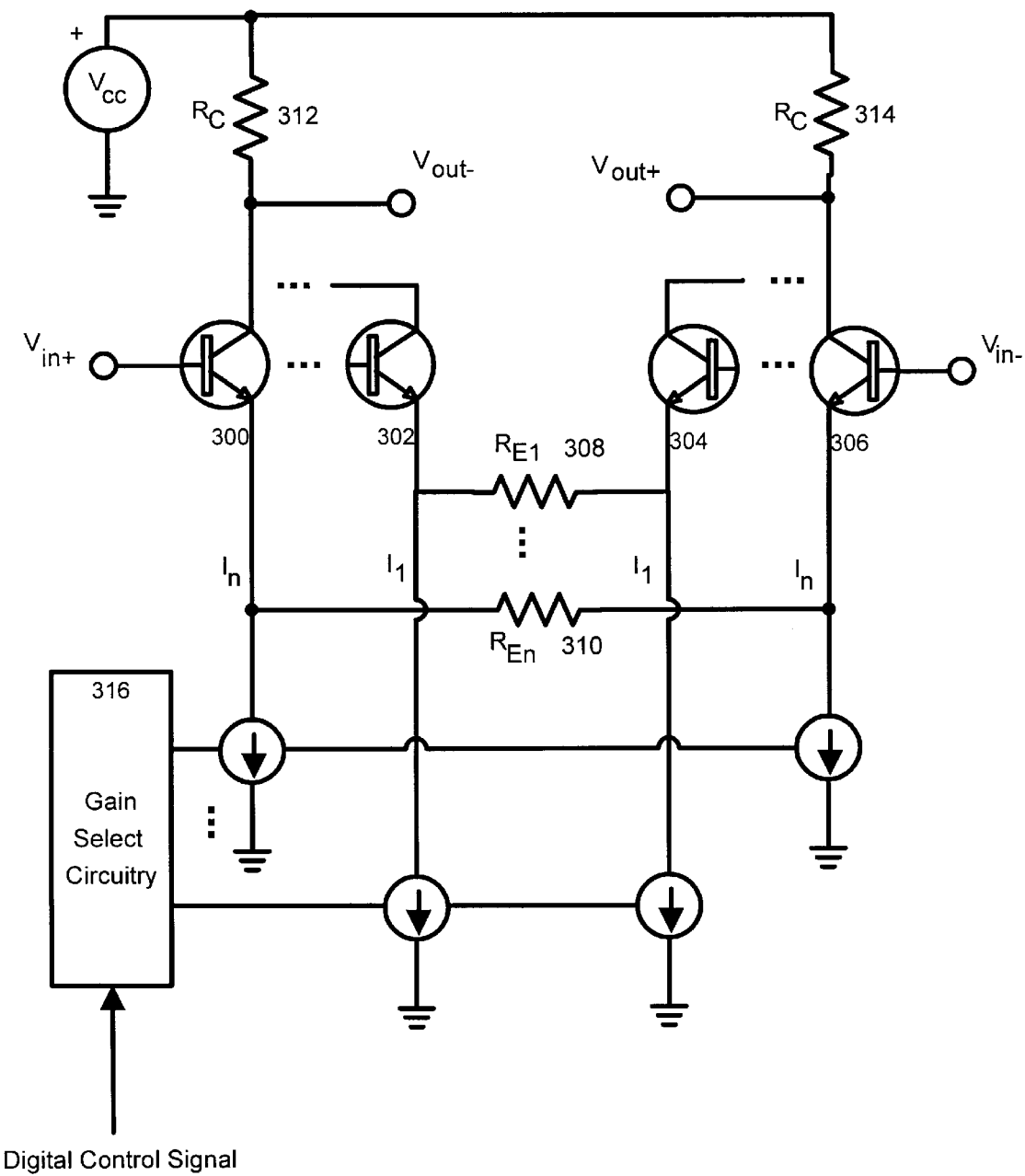
FIG. 3 is a block diagram of a multiple-tail transconductance switchable gain amplifier in accordance with the invention.

In FIG. 3, a block diagram of a variable gain amplifier in accordance with the invention is shown. This embodiment is rendered possible through the use of multiple-tail transconductance elements. The basic idea is to use a parallel structure instead of the series structure shown in FIG. 2. In this embodiment, the gain select circuitry 316 receives the digital control word and determines, by digital decoding, which differential pair (transistors 302 and 304 with resistor $R_{E1}$ 308 to transistors 300 and 306 with resistor $R_{En}$ 310) should be turned on in order to achieve the required overall gain value. A differential pair is turned on by switching its tail current on ($I_1$ to $I_n$). The gain for this amplifier can be calculated as:

$$A_{vt} = \frac{2R_C}{R_{Ei}} \quad \text{where } i = 1, 2, 3, \ldots, n \qquad \text{Eq. 2}$$

The values of the resistors $R_{E1}$ 308 to $R_{En}$ 310 are chosen in order to achieve the required gain values. The number of gain settings may be increased by adding more transconductance elements to the circuit.

Figure 4:
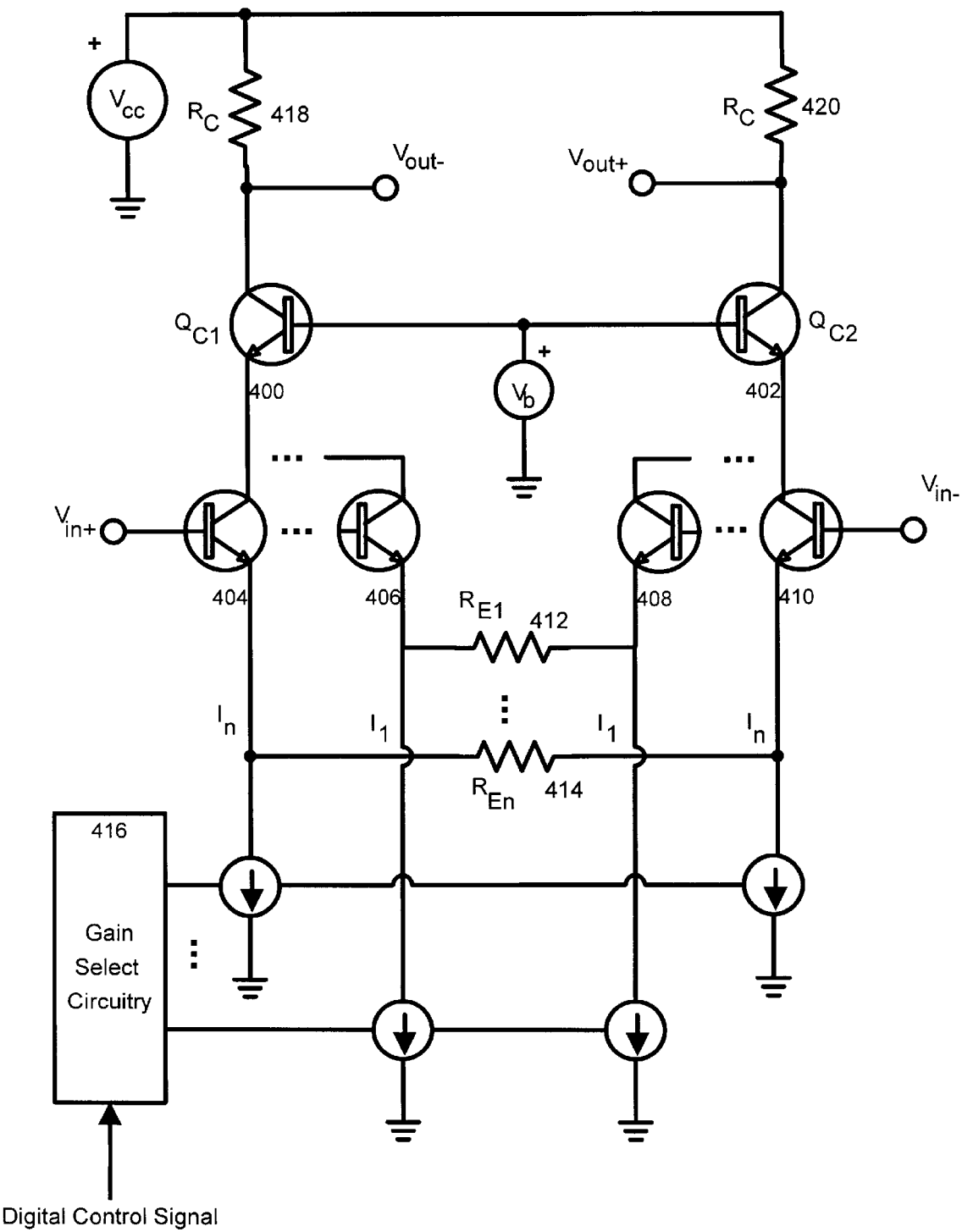
FIG. 4 is a block diagram of a multiple-tail transconductance switchable gain amplifier with cascode stage.

One characteristic of this circuit is that, as the number of parallel transistors increases, the capacitance at the output nodes increase as well. As a result, the operating frequency bandwidth of the circuit decreases. In order to correct this deficiency, a cascode stage is added to the multiple-tail transconductance switchable gain amplifier as shown in FIG. 4. The cascode stage is an isolation element that reduces the capacitive feedback admittance of the circuit, thus allowing the circuit to operate over an extended bandwidth. In this example, the feedback admittance would be a measure of the capacity of the circuit to let alternating current flow between its output and its input. The isolation element includes transimpedance buffers (solid state switches transferring the voltage signal into a current signal) in the form of transistors $Q_{C1}$ 400 and $Q_{C2}$ 402 that are connected to the collectors of the transistors 404 to 410, respectively. The function of transistors $Q_{C1}$ and $Q_{C2}$ is to separate the output nodes from the high capacitance nodes. As a result, the bandwidth of the circuit is much less affected by its parallel structure. In this embodiment, the gain select circuitry 416 functions in the same manner as in the embodiment described at FIG. 2.

In the circuits described in FIGS. 3 and 4, the current consumption can be greatly reduced compared to the circuit described in FIG. 2 where one differential pair in each dual-gain stage needs to be turned on for each gain setting. Also, in FIGS. 3 and 4 there is no need for supplementary DC level shifting circuitry between each gain stage as in FIG. 2. This results in less design complexity and even more current savings. For example, considering the case of an eight-gain value amplifier, three dual-gain stages are required for eight gain settings in the configuration of FIG. 2. In this case, three transistor pairs need to be turned on for each gain setting and two level shifters are required between the dual-gain stages. On the other hand, with the configurations in FIGS. 3 and 4, eight differential pairs in parallel are required to realize eight gain settings. Only one differential pair needs to be turned on for each gain setting and no level shifter is required. Since each differential pair in the circuits of FIGS. 3 and 4 is biased with similar current in those of FIG. 2, power consumption is reduced by more than two thirds.

Figure 5:
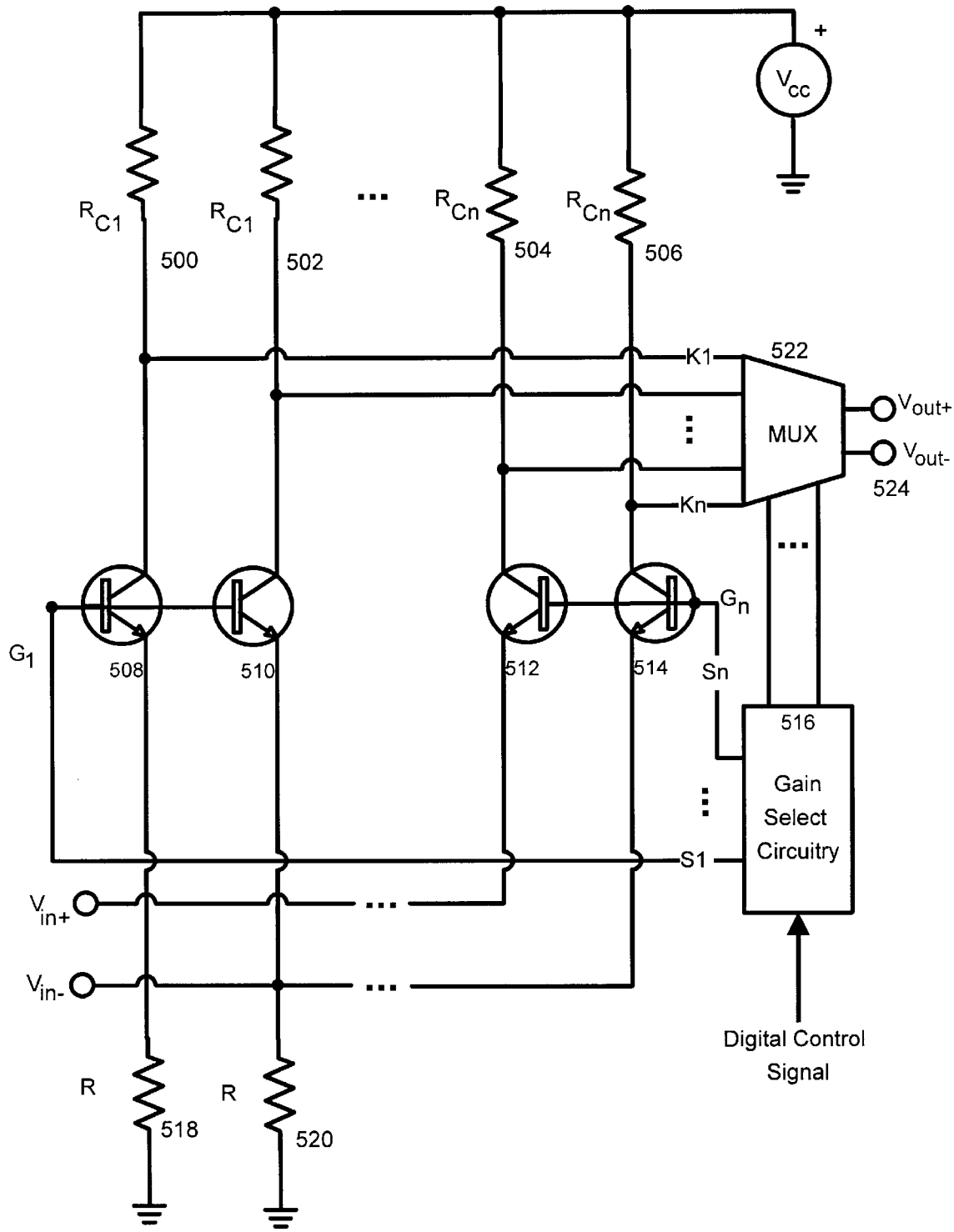
FIG. 5 is a block diagram of a common-base switchable gain amplifier using a parallel connection of emitters.

The amplifiers described in the preceding figures are all variable-gain amplifiers with tail current switching. However, the general technique described of adding gain elements in parallel is equally applicable to other variants of variable gain circuits. The common-base differential amplifier shown in FIG. 5 is such an adaptation of the parallel structure. This circuit includes a series of collector resistors $R_{C1}$ 500 to $R_{C2}$ 506, a series of transistors 508 to 514, two emitter resistors $R_E$ 518 and 520, a multiplexer 522 and a gain control circuit 516, the multiplexer 522 and the gain select circuit 516 forming a control element. The gain select circuit includes a plurality of actuation channels $S_1$ to $S_n$ connected to the base terminals of the respective gain elements to enable selective actuation of the gain elements by current injection in the respective transistor base terminals. On the other hand, the multiplexer includes a plurality of input channels $K_1$ to $K_n$, each input channel being connected to the output of a respective gain element. The multiplexer also includes an output node 524. The purpose of the multiplexer is to transfer the output voltage generated by the selected gain element to the output node.

In this circuit, the gain select circuitry 516 receives the digital control signal and determines, by digital decoding, the multiplexer 522 control selection and the transistor control voltage ($G_{1\ to\ Gn}$) in order to achieve the required overall gain value. The multiplexer is an analog switch device that can transfer to the output node $V_{out}+$ and $V_{out}-$ the voltage across the collectors of any one of the amplifier stages, in dependence upon the control signal. This control signal is preferably digital in nature, the bit combination defining the amplifier stage whose output is to be transferred. In addition to setting the multiplexer 522 to a certain output condition, the gain select circuitry also injects a current in the base terminals of the selected amplifier stage through the actuation channels $S_1$ to $S_n$. The input to the multiplexer 522 and the base terminals conductors $S_1$ to $S_n$ are therefore synchronized, the actuation of one particular base terminal conductor pair associated to a given amplifier stage, corresponding to the selection at the multiplexer 522 of the same amplifier stage output.

The gain select circuit 516 may be constructed in a number of ways. Implementation by using only hardware is preferred for reasons of simplicity. In a specific example the gain select circuit 516 can be constructed as a switch array, impressing a voltage at the actuation channel in response to the digital code impressed at the input of the gain select circuit 516. In this form of construction a suitable voltage or current source will be required (this source is not shown in the drawings).

The techniques described herein are not technology limited to bipolar junction transistors and, therefore, can be applied to other technologies such as complementary metal oxide semiconductor (CMOS) devices. Also, note that the figures and equations presented show resistors for collector loads ($R_c$) and emitter degeneration ($R_E$). The techniques presented herein are not limited to resistors and will work equally well for complex impedances in place of $R_C$ and $R_E$.

We claim:

1. A variable gain amplifier circuit comprising:
   an array of amplification gain elements capable of amplifying a signal to different gain values, each gain element of said array of gain elements being connected in parallel to one another, said array comprising at least three amplification gain elements;
   an input node in a first electrical pathway with said array of amplification gain elements to permit an electrical signal impressed to said input node to propagate to a selected one of said gain elements;
   a control unit in operative relationship with said array of amplification gain elements to activate a selected one of said gain elements in dependence of a desired level of signal amplification;
   an output node in a second electrical pathway with said array of amplification gain elements, a gain element of said array activated by said control unit impressing at said output node an output signal;
   a parasitic capacitance isolation element in said second electrical pathway between said array of amplification gain elements and said output node, said parasitic capacitance isolation element including a cascode stage and being operative to decrease a capacitive feedback admittance of said output node.

2. A variable gain circuit as defined in claim 1, wherein each gain element includes a transconductance cell.

3. A variable gain circuit as defined in claim 2, wherein said transconductance cell includes two symmetric branches, each branch including a transistor.

4. A variable gain circuit as defined in claim 3, wherein each branch also includes an impedance component in series with said transistor.

5. A variable gain circuit as defined in claim 4, wherein said impedance element is a resistor.

6. A variable gain circuit as defined in claim 5, wherein different gain elements of said array include resistors of different values to realize different levels of signal amplification.

7. A variable gain circuit as defined in claim 5, wherein said resistor is in an electrical pathway between said transistor and ground.

8. A variable gain amplifier circuit comprising:
   an array of amplification gain elements capable of amplifying a signal to different gain values;
   each gain element including a gain element input and a gain element output, an input signal impressed at said gain element input causing said gain element to impress at said gain element output an output signal related to said input signal by a certain gain value;
   each gain element also including a solid state switch responsive to a signal to activate the gain element and permit the generation of said output signal upon application of said input signal at said gain element input;
   a control unit in operative relationship with said array of amplification gain elements to activate a selected one of said gain elements in dependence of a desired level of signal amplification, said control unit including:
   a) a plurality of actuation channels, each actuation channel being connected to a solid state switch of a corresponding gain element;
   b) a plurality of output channels associated to respective gain elements, each output channel being connected to the gain element output of a respective gain element;
   an output node, said control unit being responsive to a control signal indicative of a desired gain value to:
   a) generate a signal on an actuation channel of a selected one of said gain elements corresponding to the desired gain value to actuate said selected one of said gain elements;
   b) establish a connection between said output node and the output channel connected to the gain element output of said selected one of said gain elements, thereby permitting to transfer to said output node the output signal generated at the gain element output of said selected one of said gain elements.

9. A variable gain amplifier circuit as defined in claim 8, wherein gain elements of said array of gain elements are connected in parallel to one another.

10. A variable gain circuit as defined in claim 9, wherein each gain element includes two symmetric branches, each branch including a transistor.

11. A variable gain circuit as defined in claim 10, wherein each branch also includes an impedance component in series with said transistor.

12. A variable gain circuit as defined in claim 11, wherein said impedance element is a resistor.

13. A variable gain circuit as defined in claim 12, wherein different gain elements of said array include resistors of different values to realize different levels of signal amplification.

14. A variable gain circuit as defined in claim 13, wherein each actuation channel is connected to a base terminal of said transistor.

* * * * *